US012757772B2

(12) United States Patent
Cheng

(10) Patent No.: US 12,757,772 B2
(45) Date of Patent: Oct. 6, 2026

(54) COMPOSITE SUBSTRATE, MANUFACTURING METHOD THEREOF, AND SEMICONDUCTOR DEVICE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 498 days.

(21) Appl. No.: 18/344,023

(22) Filed: Jun. 29, 2023

(65) Prior Publication Data

US 2024/0006257 A1 Jan. 4, 2024

(30) Foreign Application Priority Data

Jun. 30, 2022 (CN) ......................... 202210762926.9

(51) Int. Cl.

*H10W 70/68* (2026.01)
*H10P 14/20* (2026.01)
*H10W 70/698* (2026.01)

(52) U.S. Cl.

CPC ......... *H10W 70/68* (2026.01); *H10P 14/2903* (2026.01); *H10P 14/2905* (2026.01); *H10P 14/2926* (2026.01); *H10W 70/698* (2026.01)

(58) Field of Classification Search

CPC . H01L 23/13; H01L 23/147; H01L 21/02376; H01L 21/02381; H01L 21/02433; H01L 21/02002; H01L 21/76251; H10H 20/01; H10H 20/82; H10H 20/857; H10W 70/68; H10W 70/698; H10W 10/181; H10P 14/2903; H10P 14/2905; H10P 14/2926; H10P 10/126; H10P 90/00; H10P 90/1914

See application file for complete search history.

(56) References Cited

U.S. PATENT DOCUMENTS

| | | | | |
|---|---|---|---|---|
| 6,335,535 | B1 * | 1/2002 | Miyake | H10F 71/121 313/363.1 |
| 7,288,458 | B2 * | 10/2007 | Adetutu | H01L 21/76254 257/E21.32 |
| 2019/0148586 | A1 * | 5/2019 | Zhang | H10H 20/818 257/13 |

* cited by examiner

*Primary Examiner* — Quovaunda Jefferson
(74) *Attorney, Agent, or Firm* — Westbridge IP LLC

(57) ABSTRACT

Disclosed are a composite substrate, a manufacturing method thereof and a semiconductor device. The composite substrate includes a first substrate, a bonding layer, and a second substrate which are stacked sequentially, where the first substrate comprises a plurality of protruding structures disposed on a side close to the second substrate, and a groove formed between at least two protruding structures of the plurality of protruding structures. The composite substrate provided by the present disclosure, by setting a bonding layer, a bond strength between the first substrate and the second substrate may be improved, and a mechanical strength of the composite substrate is enhanced. By setting the groove, a stress transmitted from the second substrate to the first substrate may be attenuated, so as to improve the mechanical strength of the composite substrate and avoid a plastic deformation in a subsequent epitaxial process.

19 Claims, 4 Drawing Sheets

COMPOSITE SUBSTRATE, MANUFACTURING METHOD THEREOF, AND SEMICONDUCTOR DEVICE

CROSS-REFERENCE TO RELATED APPLICATIONS

The present disclosure claims priority to Chinese Patent Application No. 202210762926.9, filed on Jun. 30, 2022, all contents of which are incorporated herein in its entirety by reference.

TECHNICAL FIELD

The present disclosure relates to the technical field of semiconductor substrates, and in particular, to a composite substrate, a manufacturing method thereof and a semiconductor device.

BACKGROUND

Currently, a commercial GaN substrate with a high-quality and a large-size is rare, and Gallium Nitride based device is generally grown on a substrate such as sapphire, SiC, or silicon by heteroepitaxy methods. As an important Gallium Nitride heteroepitaxial substrate, a silicon substrate has the advantages of high crystal quality, large wafer size, high thermal conductivity (about 3 times that of the sapphire), low price, and substrate conductivity that may be controlled by doping, and the silicon substrate has attracted more and more attention from the industry. There are two main technical difficulties in the heteroepitaxial growth of a GaN film on the silicon substrate: one is that there is a large lattice mismatch (16.9%) between a GaN epitaxial film and the silicon substrate, which leads to a large number of penetrating dislocations in the epitaxial film, resulting in a poor crystal quality of the epitaxial film. Another more important is that there is a huge thermal mismatch (54%) between the silicon substrate and a Gallium Nitride film, which makes an epitaxial warpage of the silicon based Gallium Nitride difficult to control, and an edge of the epitaxial film is easy to crack. Generally, the solution to the huge thermal mismatch between the silicon substrate and the Gallium Nitride film is to use a lattice mismatch (2.4%) between AlN and GaN to introduce enough compressive stress to compensate for a tensile stress generated by the thermal mismatch during a high-temperature epitaxial growth of the Gallium Nitride, so as to obtain an epitaxial wafer with low stress and low warpage.

SUMMARY

The purpose of the present disclosure is to improve a mechanical strength of a substrate, and further improve an epitaxial crystal quality of subsequent manufacturing of a semiconductor structure.

In order to achieve the above purpose, the present disclosure provides a composite substrate, including: a first substrate, a bonding layer, and a second substrate which are stacked sequentially, where the first substrate includes a plurality of protruding structures disposed on a side close to the second substrate, and a groove formed between at least two protruding structures of the plurality of protruding structures; and the bonding layer at least partially covers the protruding structures.

Furtherly, the bonding layer covers a bottom surface and a surface at a side, close to the first substrate, of the groove.

Furtherly, a material of the bonding layer and a material of the second substrate are the same.

Furtherly, the bonding layer includes a first bonding layer and a second bonding layer, and the first bonding layer and the second bonding layer are stacked in a thickness direction of the first substrate.

Furtherly, the second substrate includes SiC, and the bonding layer includes SiC, SiCN or SiCAlN.

Furtherly, the first substrate, the bonding layer, and the second substrate are all made of an N-type doped semiconductor material.

Furtherly, a cross section of the groove perpendicular to a plane where the first substrate is located includes a polygon or an arcuate shape.

Furtherly, a first dielectric layer which is patterned is disposed on a side, close to the second substrate, of the protruding structures, the first dielectric layer includes a plurality of openings, and the plurality of openings are in a one-to-one correspondence with a plurality of grooves.

Furtherly, the first substrate is a multilayer structure, the first substrate includes a first sublayer and the protruding structures located above the first sublayer, and a material of the first sublayer and a material of the protruding structures are different.

Furtherly, a projection shape of the groove in a plane where the first substrate is located includes any of a polygon or a circle.

Furtherly, a side length of the polygon ranges from 1 um to 1 mm, or a diameter of the circle ranges from 1 um to 1 mm.

Furtherly, the composite substrate further including a third bonding layer, where the third bonding layer covers a surface at a side, close to the first substrate, of the second substrate.

Furtherly, a material of the third bonding layer and a material of the bonding layer are the same.

Furtherly, a chamfer is formed on a side wall of the first substrate and a side wall of the second substrate.

Furtherly, the composite substrate further including a second dielectric layer, where the second dielectric layer conformally covers a side wall of the first substrate, a surface at a side, away from the second substrate, of the first substrate, and a side wall of the second substrate.

Furtherly, a material of the first substrate is silicon with a crystal orientation of (100), and a material of the second substrate is silicon with a crystal orientation of (111).

The present disclosure also provides a semiconductor device, including the above composite substrate, a nucleation layer, a buffer layer, and a device layer, where the nucleation layer, the buffer layer, and the device layer which are sequentially disposed on a second substrate of the composite substrate.

The present disclosure also provides a manufacturing method for a composite substrate, including: patterning and etching on a side of a first substrate to form a plurality of protruding structures, and a groove formed between at least two protruding structures of the plurality of protruding structures; forming a bonding layer on a side, away from the first substrate, of the plurality of protruding structures, and the bonding layer at least partially covering the protruding structures; and bonding a second substrate to a side, away from the first substrate, of the bonding layer.

Furtherly, the forming a bonding layer on a side, away from the first substrate, of the plurality of protruding structures includes: forming, by an epitaxial process, the bonding layer on the side, away from the first substrate, of the plurality of protruding structures.

Furtherly, the first substrate is made of silicon and the second substrate is made of SiC; where the forming a bonding layer on a side, away from the first substrate, of the plurality of protruding structures includes: carbonizing the side, away from the first substrate, of the plurality of protruding structures to form a SiC layer, and the SiC layer is the bonding layer.

DETAILED DESCRIPTION OF THE EMBODIMENTS

The following clearly and completely describes the technical solutions in the embodiments of the present disclosure with reference to the accompanying drawings in the embodiments of the present disclosure. Apparently, the described embodiments are only some rather than all of the embodiments of the present disclosure. All other embodiments obtained by a person of ordinary skill in the art based on the embodiments of the present application without creative efforts fall within the protection scope of the present disclosure.

Figure 1:
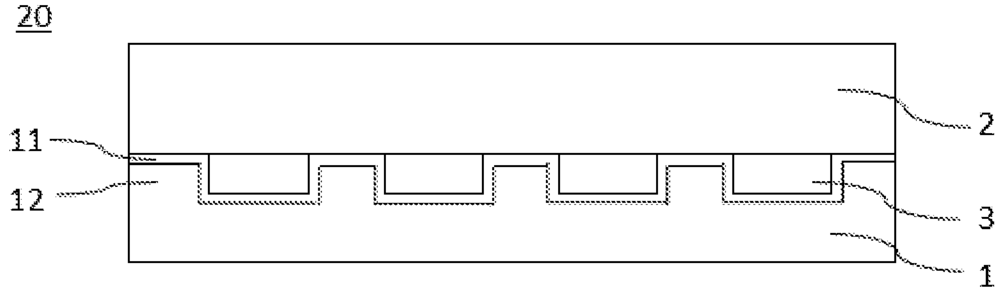
FIG. 1 is a schematic structural diagram according to an embodiment of the present disclosure.

In an embodiment, FIG. 1 is a schematic structural diagram according to an embodiment of the present disclosure. As shown in FIG. 1, the composite substrate 20 includes a first substrate 1, a bonding layer 11, and a second substrate 2 which are stacked sequentially. The first substrate 1 includes a plurality of protruding structures 12 disposed on a side close to the second substrate 2, a groove 3 formed between at least two protruding structures 12; and the bonding layer 11 at least partially covers the protruding structures 12.

Specifically, as shown in FIG. 1, in an arrangement direction, such as a left-to-right arrangement, the plurality of protruding structures 12 and a plurality of grooves 3 are arranged in an alternating pattern. In other words, there is a groove 3 between each two protruding structures 12, or, there is a protruding structure 12 between each two grooves 3.

Figure 2:
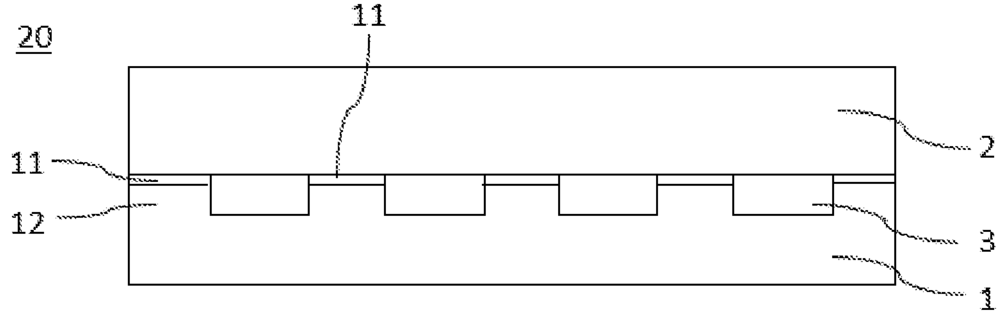
FIG. 2 is a schematic structural diagram according to an embodiment of the present disclosure.

Specifically, FIG. 2 is a schematic structural diagram according to an embodiment of the present disclosure. As shown in FIG. 2, the bonding layer 11 at least partially covers the protruding structures 12, and the bonding layer 11 covers a surface at a side, close to the second substrate 2, of the protruding structures 12. By setting the bonding layer 11, a bond strength between the first substrate 1 and the second substrate 2 may be improved, and a mechanical strength of the composite substrate 20 is enhanced.

It should be noted that the groove 3 is used to attenuate a stress transmitted from the second substrate 2 to the first substrate 1. Furtherly, the first substrate 1 is bonded with the second substrate 2 to improve the mechanical strength of the composite substrate 20, and avoid a plastic deformation in a subsequent epitaxial process.

In an embodiment, as shown in FIG. 1, the bonding layer 11 covers a surface at a side, close to the first substrate 1, of the groove 3. Specifically, the bonding layer 11 covers a surface at a side, close to the second substrate 2, of the protruding structures 12, and covers a bottom surface and the surface at a side, close to the first substrate 1, of the groove 3. In other words, the bonding layer 11 covers the whole surface, close to the second substrate 2, of the first substrate 1. It should be noted that after the bonding layer 11 is formed on the surface, close to the second substrate 2, of the first substrate 1, no other process steps are needed to retain only the bonding layer 11 which covers the protruding structures 12, avoid damaging a structure of the first substrate 1, and simplify a process flow.

Figure 3:
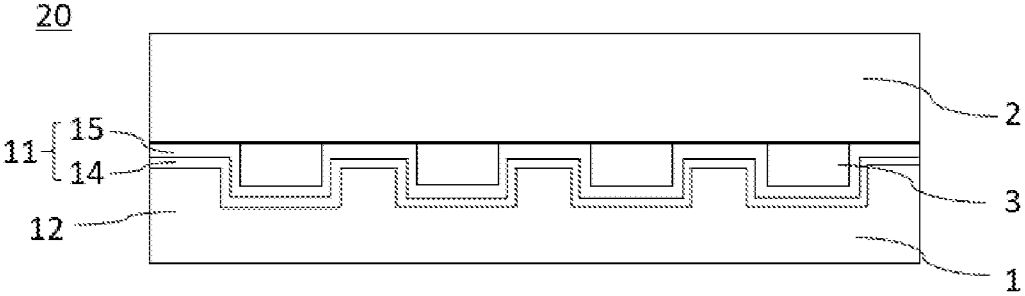
FIG. 3 is a schematic structural diagram according to an embodiment of the present disclosure.

In an embodiment, as shown in FIG. 3, the bonding layer 11 includes a first bonding layer 14 and a second bonding layer 15, and the first bonding layer 14 and the second bonding layer 15 are stacked in a thickness direction of the first substrate 1. The first bonding layer 14 and the second bonding layer 15 cover the whole surface, close to the second substrate 2, of the first substrate 1.

Optionally, the first bonding layer 14 includes $Al_2O_3$, and the second bonding layer 15 includes SiC. The mechanical strength and hardness of the composite substrate 20 may be improved by using multi-layer bonding layer such as $Al_2O_3$ as a material of the bonding layer, and $Al_2O_3$ also has the advantages of good optical properties, good transparency and insulation, wear resistance, corrosion resistance, chemical inertness, and the like.

In an embodiment, a material of the bonding layer 11 and a material of the second substrate 2 are the same. The bonding layer 11 and the second substrate 2 using the same material can further improve a bond strength between the first substrate 1 and the second substrate 2, and avoid a problem of a poor epitaxial crystal quality caused by a lattice mismatch and a thermal mismatch of the composite substrate 20 in a subsequent manufacturing of a semiconductor device, and improve the mechanical strength of the composite substrate 20.

Optionally, the second substrate 2 includes SiC, and the bonding layer 11 includes SiC or SiCN or SiCAlN. The bonding layer 11 may be a silicon carbide material, including SiCN or SiCAlN, and SiCAlN may be an alloy material.

In an embodiment, the material of the bonding layer 11 and the material of the second substrate 2 are both SiC. When the material of the bonding layer 11 is SiC, the bonding layer 11 may be formed by a mature epitaxial process in semiconductor manufacturing, and then the composite substrate 20 is formed by bonding the second substrate 2 of the SiC material. It should be noted that, first of all, the composite substrate 20 of the same material may avoid the problem of the poor epitaxial crystal quality caused by the lattice mismatch and the thermal mismatch in the subsequent manufacturing of the semiconductor device, and improve the mechanical strength of the composite substrate 20. Furthermore, SiC, as a wide bandgap semiconductor with a wider bandgap than the silicon, has the advantages of a higher breakdown voltage, a lower conduction resistance, and a less performance degradation in high temperature environments, which may further improve an application of the composite substrate 20 in the semiconductor device.

It should be noted that the crystal state of SiC is not limited in the present disclosure, and the SiC may be a single crystal material, or a polycrystalline, a ceramic, an amorphous and other states.

In an embodiment, the first substrate 1, the bonding layer 11, and the second substrate 2 are all made of an N-type doped semiconductor material. Specifically, the composite substrate 20 is an N-type doped substrate, which may be used as an N-type semiconductor layer of the semiconductor device. Subsequently, other semiconductor layers are selectively formed on a top of the composite substrate 20 according to different applications, without the need to make the N-type semiconductor layer on the substrate first, and then make other semiconductor layers, which may effectively simplify the semiconductor manufacturing process.

Optionally, the first substrate 1, the bonding layer 11, and the second substrate 2 are all made of an N-type doped semiconductor material.

Figure 4:
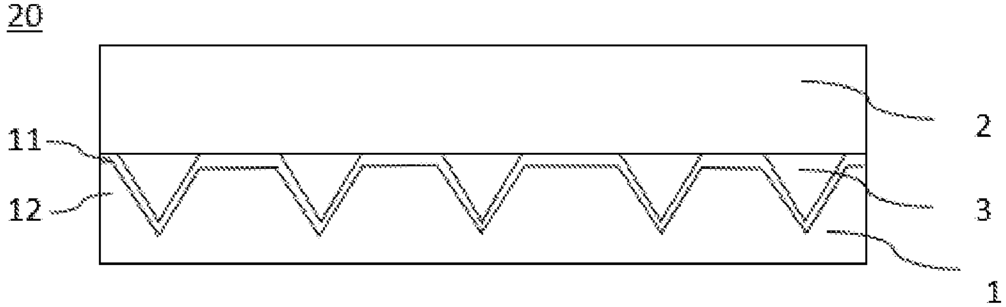
FIG. 4 is a schematic structural diagram according to an embodiment of the present disclosure.
Figure 5:
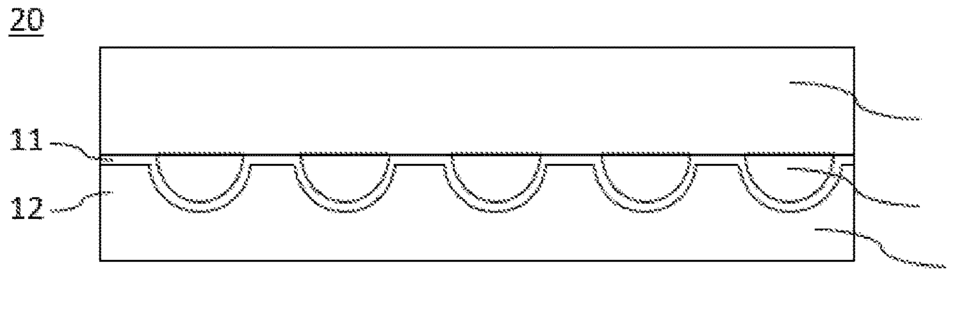
FIG. 5 is a schematic structural diagram according to an embodiment of the present disclosure.

In an embodiment, FIG. 4 is a schematic structural diagram according to an embodiment of the present disclosure, and FIG. 5 is a schematic structural diagram according to an embodiment of the present disclosure. As shown in FIGS. 1 to 5, a cross section of a groove 3 perpendicular to a plane where the first substrate is located includes a polygon or an arcuate shape. Specifically, the polygon may be rectangle or triangle or other shape. As shown in FIG. 1 and FIG. 2, the cross section of the groove 3 perpendicular to the plane where the first substrate is located is rectangular. As shown in FIG. 4, the cross section of the groove 3 perpendicular to the plane where the first substrate is located is triangular. Optionally, the cross section of the groove 3 perpendicular to the plane where the first substrate 1 is located may also be pentagonal, hexagonal, and the like. The number and length of sides of the polygon are not limited in the present disclosure.

Specifically, as shown in FIG. 5, the cross section of the groove 3 perpendicular to the plane where the first substrate 1 is located is the arcuate shape. It should be noted that the arcuate shape may be composed of an arc and a line segment, and a radius of curvature of the arc is not limited in the present disclosure. Optionally, the arcuate shape may be semicircular.

Figure 6:
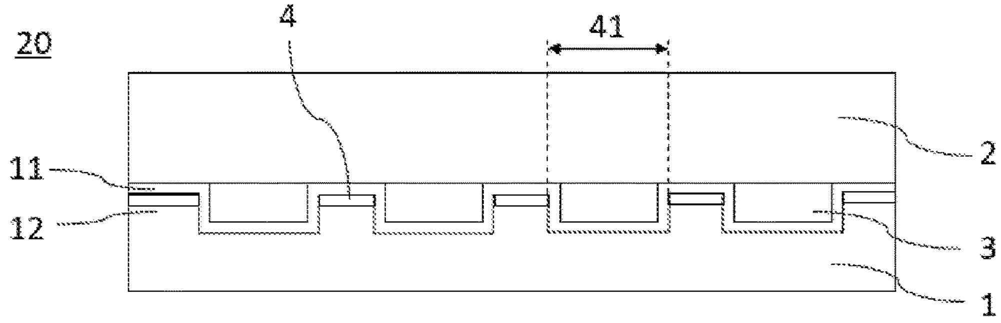
FIG. 6 is a schematic structural diagram according to an embodiment of the present disclosure.

In an embodiment, FIG. 6 is a schematic structural diagram according to an embodiment of the present disclosure. As shown in FIG. 6, a first dielectric layer 4 which is patterned is disposed on a side, close to the second substrate 2, of the protruding structures 12. The first dielectric layer 4 includes a plurality of openings 41, and the plurality of openings 41 are in a one-to-one correspondence with a plurality of grooves 3.

Specifically, the first dielectric layer 4 covers a surface at a side, close to the second substrate 2, of the protruding structures 12. The first dielectric layer 4 is patterned to form the opening 41, and the opening 41 corresponds to the groove 3 one by one. The first dielectric layer 4 may be used as a mask version of etching the first substrate 1 to form a groove 3, the manufacturing process of removing the first dielectric layer 4 is not added in the later stage, and a process flow is simplified.

Optionally, the first dielectric layer 4 includes $SiO_2$ or $Al_2O_3$.

It should be noted that, as shown in FIG. 6, the cross section of the groove 3 perpendicular to the plane where the first substrate 1 is located is rectangular. In the embodiment, a shape of the cross section of the groove 3 is not limited, and the cross section is a rectangle only for illustration.

Figure 7:
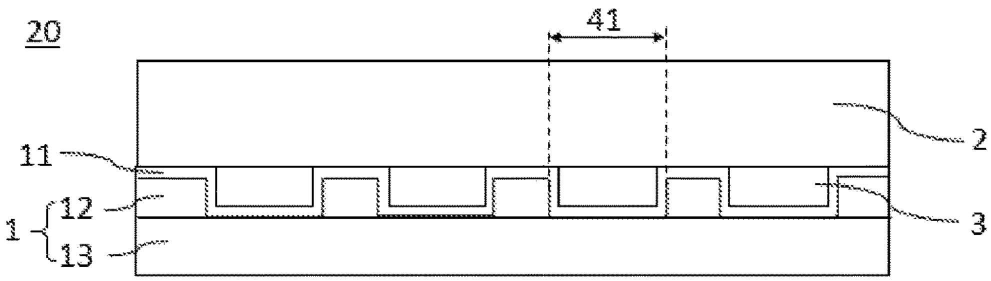
FIG. 7 is a schematic structural diagram according to an embodiment of the present disclosure.

In an embodiment, FIG. 7 is a schematic structural diagram according to an embodiment of the present disclosure. As shown in FIG. 7, the first substrate 1 is a multilayer structure, and the first substrate 1 includes a first sublayer 13 and the protruding structures 12 located above the first sublayer, and a material of the first sublayer 13 and a material of the protruding structures 12 are different. Specifically, a layer where the protruding structures 12 is located is graphically etched to form a groove 3 and the protruding structures 12. It should be noted that a material of the protruding structures which is more easily etched 12 may be selected to avoid damaging a substrate structure of the first sublayer 13. Optionally, silicon is selected for the first sublayer 13, and $SiO_2$ is selected for the protruding structures 12. As shown in FIG. 7, in the embodiment, the shape of the cross section of the groove 3 is not limited, and the cross section is a rectangle only for illustration.

Figure 8:
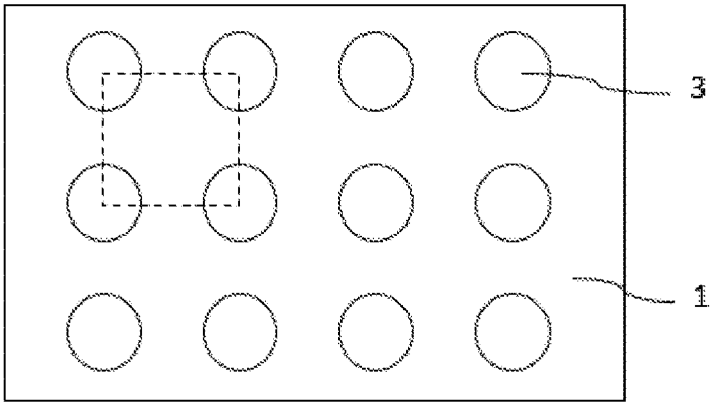
FIG. 8 is a top view of the structure according to an embodiment of the present disclosure.
Figure 9:
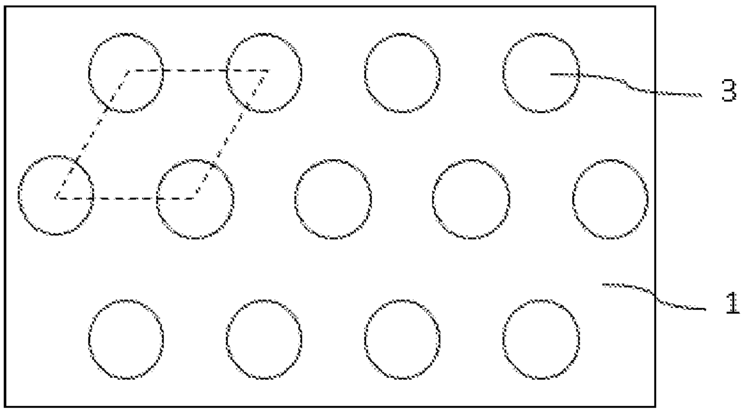
FIG. 9 is a top view of the structure according to an embodiment of the present disclosure.

In an embodiment, FIG. 8 is a top view of the structure according to an embodiment of the present disclosure, and FIG. 9 is a top view of the structure according to an embodiment of the present disclosure. As shown in FIGS. 8 and 9, a projection shape of a groove 3 in a plane where the first substrate 1 is located includes any of a polygon or a circle.

Specifically, as shown in FIG. 8, it is only shown that the projection shape of the groove 3 in the plane where the first substrate 1 is located is circular, and the projection of the groove 3 in the plane where the first substrate 1 is located is arranged in a rectangular arrangement. In other words, as shown in the rectangular dotted box of FIG. 8, in the two vertical directions, the center lines of four adjacent grooves 3 is rectangular.

Specifically, as shown in FIG. 9, it is only shown that the projection shape of the groove 3 in the plane where the first substrate 1 is located is circular, and the projection of the groove 3 in the plane where the first substrate 1 is located is arranged in a misplaced arrangement. In other words, as shown in the dashed parallelogram box in FIG. 9, in the two intersecting directions, the center lines of the four adjacent grooves 3 is a parallelogram.

It should be noted that those skilled in the art may set the shape and layout of the groove 3 according to actual needs, and the present disclosure does not limit it. It should be noted that the projection shape of the groove 3 in the plane where the first substrate 1 is located may be a polygon, a circle, or a combination of two shapes.

In an embodiment, a side length of the polygon projection of the groove 3 ranges from 1 um to 1 mm, or a diameter of the circular projection of the groove 3 ranges from 1 um to 1 mm. Those skilled in the art may set the size of the groove 3 according to actual needs.

Figure 10:
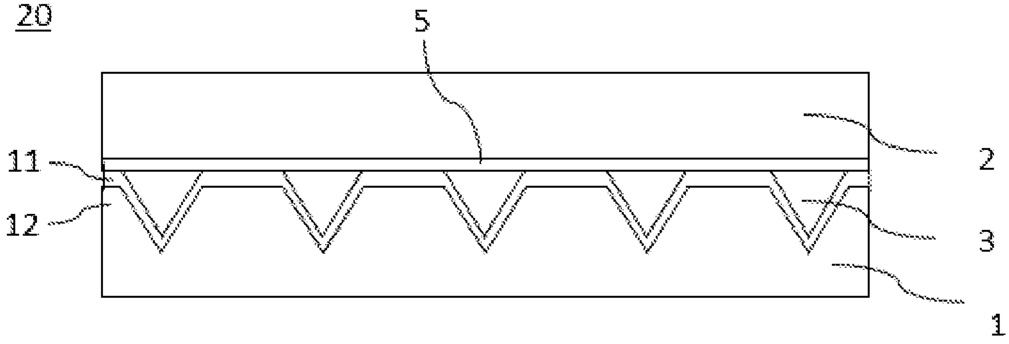
FIG. 10 is a schematic structural diagram according to an embodiment of the present disclosure.

In an embodiment, FIG. 10 is a schematic structural diagram according to an embodiment of the present disclosure. As shown in FIG. 10, the composite substrate 20 further includes a third bonding layer 5, and the third bonding layer 5 covers a surface at a side, close to the first substrate 1, of the second substrate 2.

Optionally, as shown in FIG. 10, the third bonding layer 5 completely covers the surface at the side, close to the first substrate 1, of the second substrate 2, and the first substrate 1 and the second substrate 2 are bonded by the third bonding layer 5 and the bonding layer 11 to form the composite substrate 20.

In an embodiment, a material of the third bonding layer 5 and a material of the bonding layer 11 are the same, and the bonding layer 11 and the third bonding layer 5 of the same material can further improve a bond strength between the first substrate 1 and the second substrate 2, and enhance a mechanical strength of the composite substrate 20.

Optionally, a material of the bonding layer 11 and a material of the third bonding layer 5 are SiC.

Optionally, in an embodiment, the composite substrate 20 simultaneously includes the third bonding layer 5 and the first dielectric layer 4.

As shown in FIG. 10, in the related embodiments, a shape of the cross section of the groove 3 is not limited, and the cross section is a triangle only for illustration.

Figure 11:
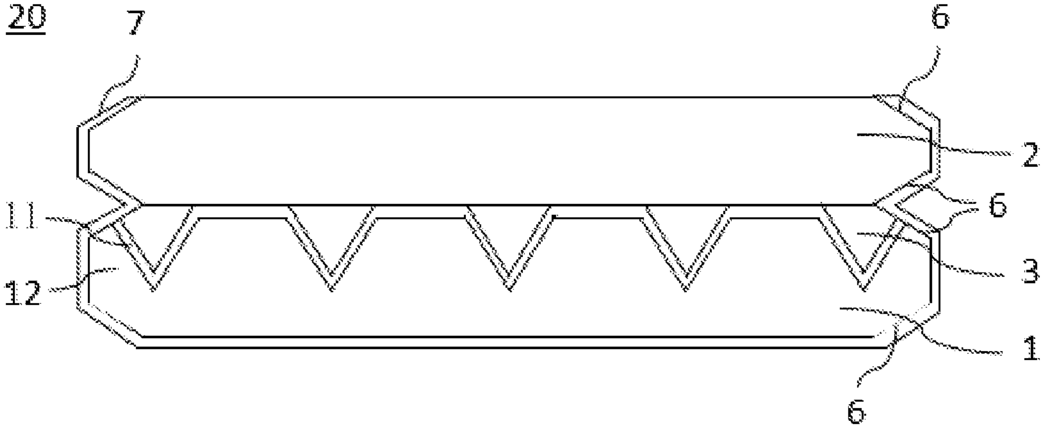
FIG. 11 is a schematic structural diagram according to an embodiment of the present disclosure.

In an embodiment, FIG. 11 is a schematic structural diagram according to an embodiment of the present disclosure. As shown in FIG. 11, a chamfer 6 is formed on a side wall of the first substrate 1 and a side wall of the second substrate 2 form. Specifically, At the boundary of the first substrate 1 and the second substrate 2, an angle between a section of the boundary and a plane where the first substrate 1 is located is not zero angle. In the epitaxial manufacturing of the semiconductor device, the setting of the chamfer 6 may improve the contact area between the composite substrate and the graphite disk, which is too large or too small, to avoid a phenomenon of cracking of the composite substrate caused by an uneven force caused by the melting factor, and further improve the crystal quality of the epitaxial layer of the semiconductor device.

Optionally, as shown in FIG. 11, a substrate boundary of an upper side and a lower side of the first substrate 1 and the second substrate 2 are each provided with the chamfer 6.

Optionally, the chamfer formed by the side wall of the first substrate 1 and the side wall of the second substrate 2 may be an arc-shaped chamfer or a chamfer formed by polyline edges 6 as shown in FIG. 11.

As shown in FIG. 11, in the related embodiment, a shape of the cross section of the groove 3 is not limited, and the cross section is a triangle only for illustration.

In an embodiment, as shown in FIG. 11, the composite substrate 20 further includes a second dielectric layer 7, and the second dielectric layer 7 is conformally covered on a side wall of the first substrate 1, a surface at a side, away from the second substrate 2, of the first substrate 1, and a side wall of the second substrate 2.

Specifically, as shown in FIG. 11, the second dielectric layer 7 covers the composite substrate 20. It should be noted that the second dielectric layer 7 protects the chamfer 6 of the side wall of the composite substrate 20, and may further reduce the defects of an edge of an epitaxial layer of the composite substrate 20, so as to improve a crystal quality of the epitaxial layer.

It should be noted that a side, away from the first substrate 1, of the second substrate 2, is not provided with the second dielectric layer 7, so as to facilitate the subsequent manufacturing of the semiconductor device.

In an embodiment, a material of the first substrate 1 is silicon with a crystal orientation of (100), and a material of the second substrate 2 is silicon with a crystal orientation of (111). Si (111) is selected as the material of the second substrate 2, which is convenient for the later manufacturing of the semiconductor epitaxy structure by the epitaxial process.

Figure 12:
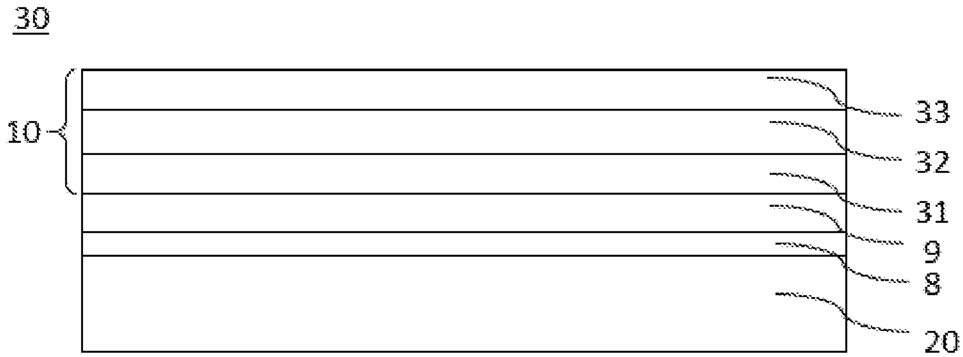
FIG. 12 is a schematic structural diagram according to an embodiment of the present disclosure.

In an embodiment, FIG. 12 is a schematic structural diagram according to an embodiment of the present disclosure. As shown in FIG. 12, a semiconductor device 30 is also provided, including a composite substrate 20 of the present disclosure, a nucleation layer 8, a buffer layer 9, and a device layer 10. The nucleation layer 8, the buffer layer 9, and the device layer 10 are sequentially disposed on a second substrate 2 of the composite substrate 20.

Specifically, the device layer 10 may be a power device, including a stack of GaN channel layer or AlGaN barrier layer. Or, as shown in FIG. 12, the device layer 10 may be an LED device, including an N-type semiconductor layer 31, a multi-quantum well stack 32, and a P-type semiconductor layer 33. Optionally, the multi-quantum well stack 32 may be InGaN or GaN.

The composite substrate 20 includes a bonding layer 11, which is conducive to improving a bond strength between the first substrate 1 and the second substrate 2, and enhancing a mechanical strength of the composite substrate 20. Furtherly, the composite substrate 20 includes a groove 3, and the groove 3 is used to attenuate a stress transmitted from the second substrate 2 to the first substrate 1, which is conducive to improving the mechanical strength of the composite substrate 20, avoiding a plastic deformation in a subsequent epitaxial process, and improving an application performance of the semiconductor device 30.

Figure 13:
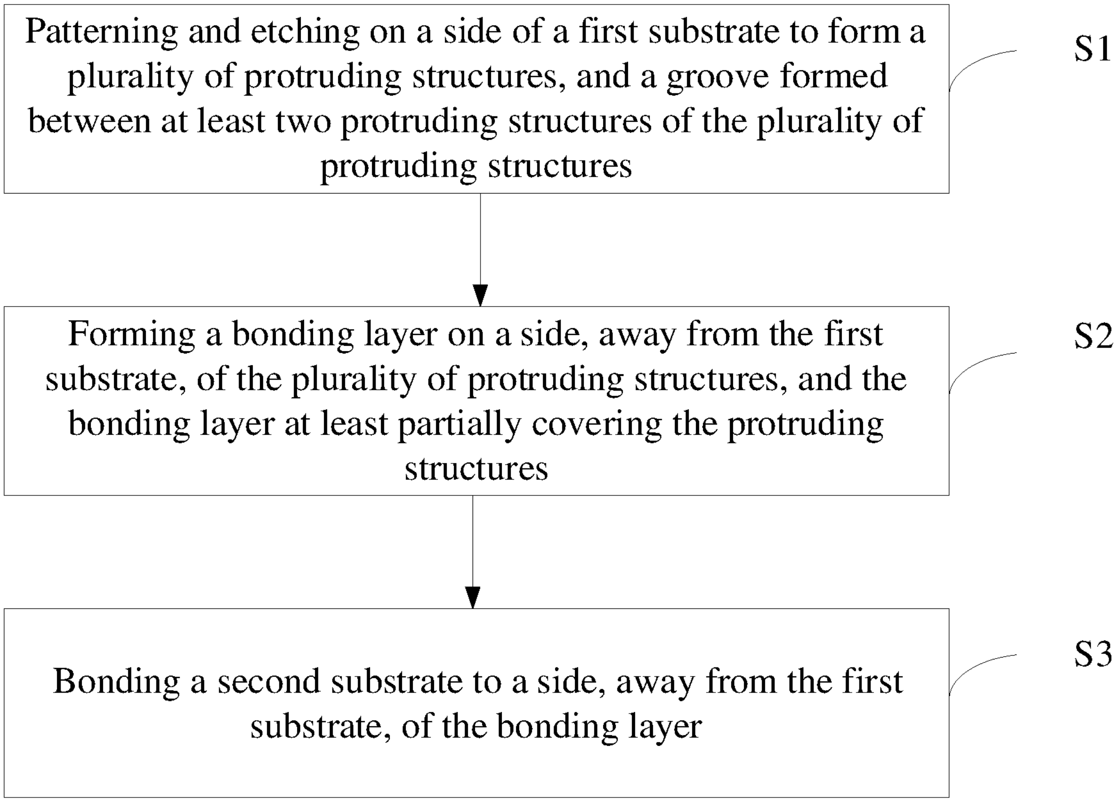
FIG. 13 is a schematic flowchart of a manufacturing method according to an embodiment of the present disclosure.

Furtherly, a manufacturing method for a composite substrate is provided, and FIG. 13 is a flowchart of a manufacturing method according to an embodiment of the present disclosure. As shown in FIG. 13, the manufacturing method includes:

Step S1, patterning and etching on a side of a first substrate to form a plurality of protruding structures, and a groove formed between at least two protruding structures of the plurality of protruding structures.

Step S2, forming a bonding layer on a side, away from the first substrate, of the plurality of protruding structures, and the bonding layer at least partially covering the protruding structures.

Step S3, bonding a second substrate to a side, away from the first substrate, of the bonding layer.

Specifically, as shown in FIG. 1, in an arrangement direction, such as a left-to-right arrangement, the plurality of protruding structures 12 and a plurality of grooves 3 are arranged in an alternating pattern. In other words, there is a groove 3 between each two protruding structures 12, or, there is a protruding structure 12 between each two grooves 3.

Specifically, the bonding layer 11 may be formed on the side, away from the first substrate 1, of the protruding structures 12 by an epitaxial method. In other words, the bonding layer 11 is formed on a surface of the first substrate 1 by the epitaxial process. Optionally, a material of the bonding layer 11 and a material of the second substrate 2 are SiC. It should be noted that, the composite substrate 20 using the same kind of material may avoid a problem of a poor epitaxial crystal quality caused by a lattice mismatch and a thermal mismatch in a subsequent manufacturing of the semiconductor device, and improve the mechanical strength of the composite substrate 20. Furthermore, SiC, as a wide bandgap semiconductor with a wider bandgap than the silicon, has the advantages of a higher breakdown voltage, a lower conduction resistance, and a less performance degradiation in high temperature environments, which may further improve an application of the composite substrate 20 in the semiconductor device.

Optionally, the first substrate 1 is made of silicon and the second substrate 2 is made of SiC. The method of forming the bonding layer 11 on a side, away from the first substrate 1, of the plurality of protruding structures 12 includes: carbonizing the side, away from the first substrate 1, of the plurality of protruding structures 12 to form a SiC layer. At this time, the SiC layer is the bonding layer 11, and then the composite substrate 20 is formed by a bonding process.

Optionally, after completing the step S3 for bonding the second substrate 2, the composite substrate 20 with a thinner second substrate 2 may be manufactured by a thinning process.

According to the composite substrate provided by the present disclosure, by setting a bonding layer, a bond strength between the first substrate and the second substrate may be improved, and the mechanical strength of the composite substrate is enhanced. By setting the groove, a stress transmitted from the second substrate to the first substrate may be attenuated, so as to improve the mechanical strength of the composite substrate and avoid a plastic deformation in a subsequent epitaxial process.

Each embodiment in the present disclosure is described in a progressive manner, and each embodiment focuses on the difference from other embodiments, and the same similar parts between each embodiment can refer to each other. For the device disclosed by the embodiments, because it corresponds to the method disclosed by the embodiments, the description is relatively simple, and the relevant points can be described in the method section.

The above description of the present disclosed embodiment enables those skilled in the art to realize or use the present disclosure. A variety of modifications of these embodiments will be obvious to those skilled in the art, and the general principles defined herein may be implemented in other embodiments without departing from the spirit or scope of the present invention. Accordingly, the present disclosure will not be limited to these embodiments shown herein, but will conform to the widest range consistent with the principles and novel features disclosed herein.

What is claimed is:

1. A composite substrate, comprising:

a first substrate, a bonding layer, and a second substrate which are stacked sequentially, wherein the first substrate comprises a plurality of protruding structures disposed on a side close to the second substrate, and a groove formed between at least two protruding structures of the plurality of protruding structures;

the bonding layer at least partially covers the protruding structures; and the second substrate has an epitaxial growth surface distal to the bonding layer, wherein the epitaxial growth surface is configured for epitaxially growing a semiconductor device structure thereon, and the first substrate, the bonding layer, and the second substrate are all made of an N-type doped semiconductor material.

2. The composite substrate according to claim 1, wherein the bonding layer covers a bottom surface and a surface at a side, close to the first substrate, of the groove.

3. The composite substrate according to claim 2, wherein the bonding layer comprises a first bonding layer and a second bonding layer, and the first bonding layer and the second bonding layer are stacked in a thickness direction of the first substrate.

4. The composite substrate according to claim 1, wherein a material of the bonding layer and a material of the second substrate are the same.

5. The composite substrate according to claim 1, wherein the second substrate comprises SiC, and the bonding layer comprises SiC, SiCN or SiCAlN.

6. The composite substrate according to claim 1, wherein a cross section of the groove perpendicular to a plane where the first substrate is located comprises a polygon or an arcuate shape.

7. The composite substrate according to claim 1, wherein a first dielectric layer which is patterned is disposed on a side, close to the second substrate, of the protruding structures, the first dielectric layer comprises a plurality of openings, and the plurality of openings are in a one-to-one correspondence with a plurality of grooves.

8. The composite substrate according to claim 1, wherein the first substrate is a multilayer structure, the first substrate comprises a first sublayer and the protruding structures located above the first sublayer, and a material of the first sublayer and a material of the protruding structures are different.

9. The composite substrate according to claim 1, wherein a projection shape of the groove in a plane where the first substrate is located comprises any of a polygon or a circle.

10. The composite substrate according to claim 9, wherein a side length of the polygon ranges from 1 μm to 1 mm, or a diameter of the circle ranges from 1 μm to 1 mm.

11. The composite substrate according to claim 1, further comprising a third bonding layer, wherein the third bonding layer covers a surface at a side, close to the first substrate, of the second substrate.

12. The composite substrate according to claim 11, wherein a material of the third bonding layer and a material of the bonding layer are the same.

13. The composite substrate according to claim 1, wherein a chamfer is formed on a side wall of the first substrate and a side wall of the second substrate.

14. The composite substrate according to claim 13, further comprising a second dielectric layer, wherein the second dielectric layer conformally covers a side wall of the first substrate, a surface at a side, away from the second substrate, of the first substrate, and a side wall of the second substrate.

15. The composite substrate according to claim 1, wherein a material of the first substrate is silicon with a crystal orientation of (100), and a material of the second substrate is silicon with a crystal orientation of (111).

16. A semiconductor device, comprising:

a composite substrate according to claim 1, a nucleation layer, a buffer layer, and a device layer, wherein the nucleation layer, the buffer layer, and the device layer which are sequentially disposed on a second substrate of the composite substrate.

17. A manufacturing method for a composite substrate, comprising:

patterning and etching on a side of a first substrate to form a plurality of protruding structures, and a groove formed between at least two protruding structures of the plurality of protruding structures;

forming a bonding layer on a side, away from the first substrate, of the plurality of protruding structures, the bonding layer at least partially covering the protruding structures; and bonding a second substrate to a side, away from the first substrate, of the bonding layer, wherein the second substrate has an epitaxial growth surface distal to the bonding layer, wherein the epitaxial growth surface is configured for epitaxially growing a semiconductor device structure thereon, and the first substrate, the bonding layer, and the second substrate are all made of an N-type doped semiconductor material.

18. The manufacturing method according to claim 17, wherein the forming a bonding layer on a side, away from the first substrate, of the plurality of protruding structures comprises:

forming, by an epitaxial process, the bonding layer on the side, away from the first substrate, of the plurality of protruding structures.

19. The manufacturing method according to claim 17, wherein the first substrate is made of silicon and the second substrate is made of SiC;

wherein the forming a bonding layer on a side, away from the first substrate, of the plurality of protruding structures comprises:

carbonizing the side, away from the first substrate, of the plurality of protruding structures to form a SiC layer, wherein the SiC layer is the bonding layer.

* * * * *